(12) United States Patent
Choudhury

(10) Patent No.: US 9,997,377 B2
(45) Date of Patent: Jun. 12, 2018

(54) METHODS OF FORMING CONFIGURABLE MICROCHANNELS IN PACKAGE STRUCTURES

(71) Applicant: INTEL CORPORATION, Santa Clara, CA (US)

(72) Inventor: Arnab Choudhury, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days. days.

(21) Appl. No.: 13/714,582

(22) Filed: Dec. 14, 2012

(65) Prior Publication Data
US 2014/0167296 A1 Jun. 19, 2014

(51) Int. Cl.
H01L 23/34 (2006.01)
H01L 23/28 (2006.01)
H01L 21/56 (2006.01)
H01L 25/065 (2006.01)
H01L 23/31 (2006.01)
H01L 23/473 (2006.01)
H01L 21/48 (2006.01)

(52) U.S. Cl.
CPC ........ H01L 21/565 (2013.01); H01L 21/4871 (2013.01); H01L 21/561 (2013.01); H01L 23/3121 (2013.01); H01L 23/473 (2013.01); H01L 25/065 (2013.01); H01L 2924/0002 (2013.01)

(58) Field of Classification Search
CPC . H01L 21/565; H01L 21/4871; H01L 23/473; H01L 23/3121; H01L 21/561; H01L 25/065; H01L 2924/0002
USPC ....... 257/796, 723, 730, 731, 712, 713, 719, 257/721; 361/679.49, 679.53, 274.2, 361/274.3, 676, 679.46, 688, 831
See application file for complete search history.

(56) References Cited

U.S. PATENT DOCUMENTS

| | | | | |
|---|---|---|---|---|
| 7,948,077 | B2* | 5/2011 | Andry et al. | 257/713 |
| 2004/0179338 | A1* | 9/2004 | Belady et al. | 361/700 |
| 2010/0187683 | A1* | 7/2010 | Bakir | H01L 23/3677 257/713 |
| 2010/0270688 | A1* | 10/2010 | Su | H01L 24/29 257/777 |
| 2013/0105135 | A1* | 5/2013 | Kulah et al. | 165/185 |

* cited by examiner

Primary Examiner — Jami M Valentine
Assistant Examiner — Dilinh Nguyen
(74) Attorney, Agent, or Firm — Schwabe, Williamson & Wyatt, P.C.

(57) ABSTRACT

Methods of forming a microelectronic packaging structure and associated structures formed thereby are described. Those methods and structures may include forming a sacrificial microchannel material on a device, forming an overmold material on the sacrificial microchannel material, and vaporizing the sacrificial microchannel material to form microchannel structures in the overmold that are conformal to the surfaces of the device.

24 Claims, 6 Drawing Sheets

METHODS OF FORMING CONFIGURABLE MICROCHANNELS IN PACKAGE STRUCTURES

BACKGROUND OF THE INVENTION

As microelectronic packaging technology advances for higher processor performance, there is a need for technologies that enable improved heat removal. Some devices, such as cell phones and tablets, that may incorporate 3D multi chip packages, possess challenges in terms of being able to operate within the skin temperature limits associated with such devices. Meeting these temperature specifications requires the development of inexpensive and high performance thermal management technologies.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
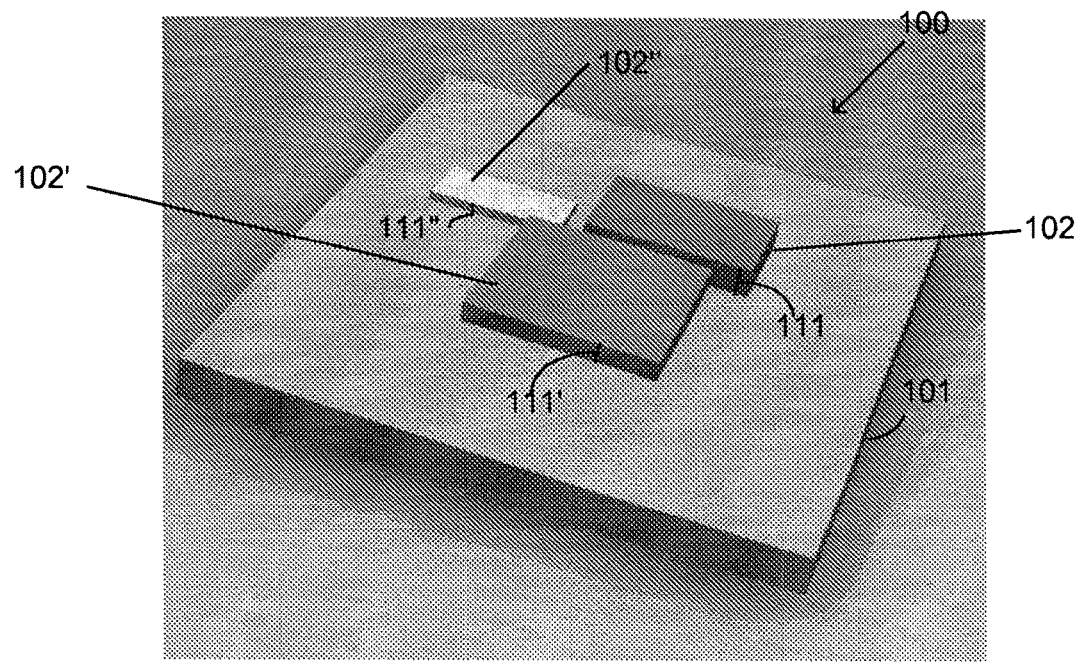
FIGS. 1a-1e represent structures according to various embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods and associated structures of forming and utilizing microelectronic structures, such as configurable microchannels for cooling devices in package structures, are described. Those methods/structures may include forming a sacrificial microchannel material on a substrate, forming an overmold material on the sacrificial microchannel material, and vaporizing the sacrificial microchannel material to form conformal microchannel structures in the overmold material. The configurable microchannel structures of the various embodiments disclosed herein enable the cooling of devices coupled with package structures, such as 3D, multi-chip package structures.

FIGS. 1a-1e illustrate embodiments of forming microchannel structures within an overmold material for cooling devices, such as devices coupled with package structures. In an embodiment, a plurality of devices 102, 102', 102" may be disposed/placed on a substrate 101 (FIG. 1a). In an embodiment, at least one of the devices 102, 102', 102" may comprise a height 111 that is different from another device disposed on the substrate 101. For example, the heights 111, 111' and 111" of the devices 102, 102' and 102" may all be different from each other. In other embodiments, at least one of the plurality of devices may be different in height than any of the other devices in the plurality of devices disposed on the substrate 101, and in other embodiments, the devices may comprise substantially the same height.

In an embodiment, the plurality of devices 102, 102', 102" may comprise at least one of a microelectronic memory die, a logic die and a central processing unit (CPU) die, but may comprise any type of suitable device 102, 102', 102" according to the particular application. In some embodiments the package structures may further comprise a plurality of dies, which may be stacked upon one another, depending upon the particular embodiment. In some cases the die(s)/devices may be located/attached/embedded on either the front side, back side or on/in some combination of the front and back sides of the package structures. In an embodiment, the devices/die(s) may be partially or fully embedded in the package structures of the embodiments.

In an embodiment, the substrate 101 may comprise a portion of a package structure 100. In an embodiment, the package structure may comprise a 3d package structure. In an embodiment, the package structure 100 may comprise a portion of a coreless, bumpless build up layer (BBUL) package structure 100. In another embodiment, the portion of the package structure 100 may comprise any suitable type of package structure 100 capable of providing electrical communications between a microelectronic device(s), such as the devices 102, 102'102", and a next-level component to which the package structure 100 may be coupled (e.g., a circuit board). In another embodiment, the package structures 100 herein may comprise any suitable type of package structures capable of providing electrical communication between a die and an upper integrated circuit (IC) package coupled with a lower IC package.

The substrate 101 of the embodiments herein may comprise a multi-layer substrate 101, including alternating layers of a dielectric material and metal—built-up around a core layer (either a dielectric or metal core). In another embodiment, the substrate 101 may comprise a coreless multi-layer substrate 101. Other types of substrates and substrate materials may also find use with the disclosed embodiments (e.g., ceramics, sapphire, glass, etc.).

Figure 1B:
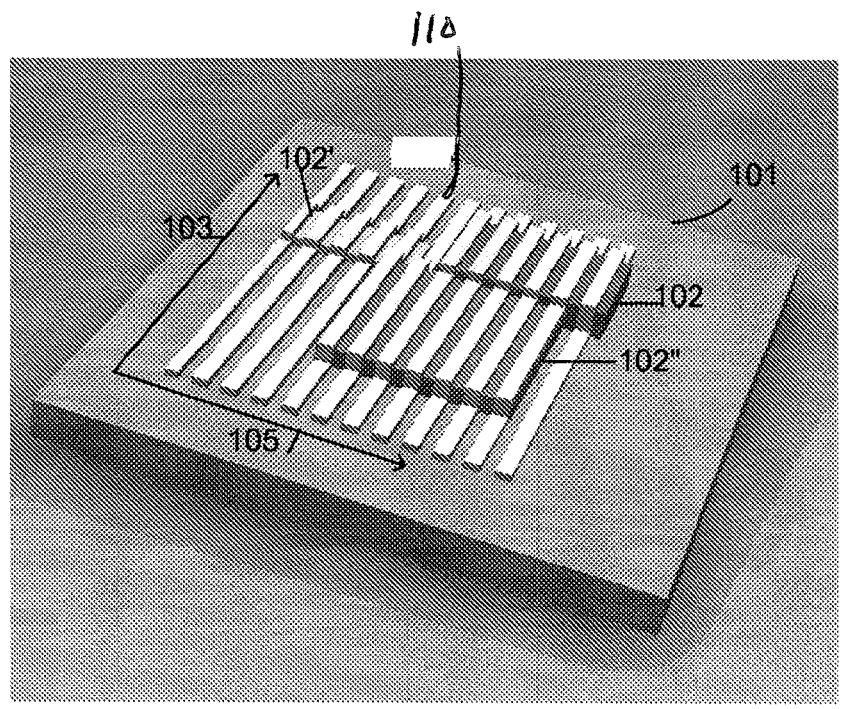
Figure 1C:
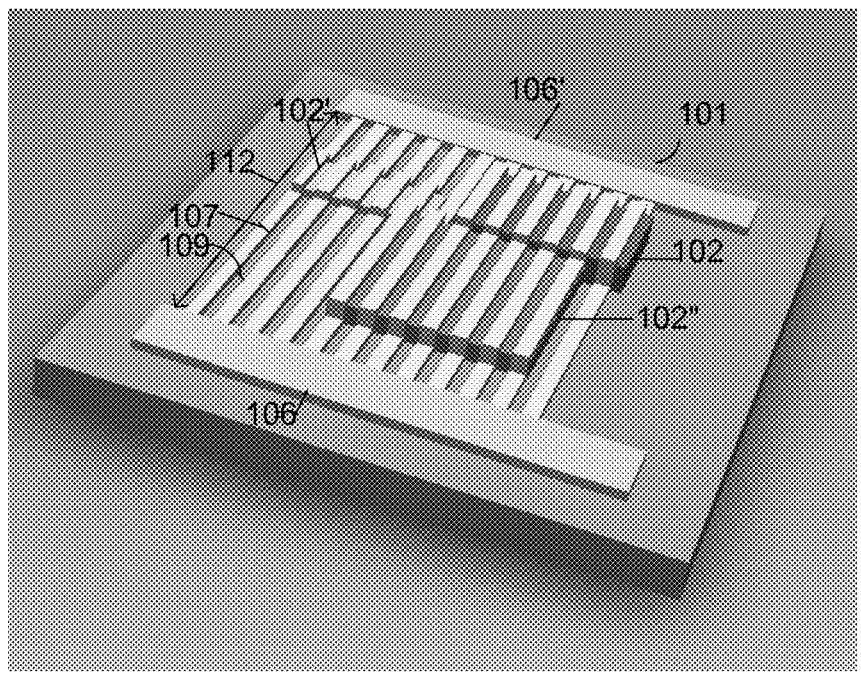

In an embodiment, sacrificial microchannel material 110 may be formed/place on the substrate 101 and on the devices 102, 102', 102" (FIG. 1b). In an embodiment, the sacrificial microchannel material 110 may comprise a material that volatizes in a temperature range that does not affect other materials/functionalities in the devices 102, 102', 102'. In an embodiment, the sacrificial microchannel material 110 may comprise a polycarbonate material that may be volatized between about 200 to about 300 degrees Celsius, but other suitable materials may be used, according to the application. In an embodiment, the sacrificial microchannel material 110 may be placed on the plurality of die 102, 102', 102" and substrate 101 in at least one direction, such as in a y direction 103 or in an x direction 105 relative to the substrate 101 (FIG. 1c). In other embodiments, the sacrificial microchannel material 110 may be oriented in any manner/directions across the plurality of devices and the substrate 101. In an embodiment, the direction may comprise at least one of a vertical, a horizontal and an angular direction. In an embodiment, a plurality of sacrificial microchannel material structures 110 (which may comprise lines in some cases and other geometric shapes in other cases) be formed on the plurality of devices. Each of the sacrificial microchannel structures 110 may conform to a top portion and side portions of individual devices of the plurality of devices.

In an embodiment, the sacrificial microchannel material 110 may be formed on the devices/substrate by forming lines of the sacrificial microchannel material by using dispensing tools, such as epoxy dispense tools, for example. In another embodiment, preforms may be placed on the substrate 101 and devices 102, 102', 102" utilizing a pick and place tool. The preforms may comprise multiple lines that define the sacrificial microchannel 110. The sacrificial microchannel material 110 may comprise a length 112, and a width 107, and there may be a space 109 between adjacent sacrificial microchannel lines 110. The magnitudes of the length 112, width 107 and space 109 of the sacrificial lines 110 may vary according to the particular design requirements.

In an embodiment, sacrificial manifolds 106, 106' may be formed adjacent to and contiguous with ends of the sacrificial microchannel material 110, wherein the sacrificial manifold material 106, 106' may comprise a volatile material, such as a polycarbonate material, in some cases. In an embodiment, the sacrificial manifold material 106, 106' may be formed on the substrate 101 and may be coupled with the sacrificial microchannel material 110 by dispensing sacrificial polycarbonate materials via dispense tools, or in other cases by placing a sacrificial polycarbonate preform on the substrate 101. A cure may be performed over a glass transition temperature of the sacrificial microchannel 110 and manifold structures 106, 106'. The cure temperature will depend on the material chosen for the sacrificial manifold and microchannel material, but in the case of polycarbonate the cure temperature may comprise the polycarbonate glass transition temperature, which may comprise a temperature below about 200 degrees, for example.

The cure may allow the sacrificial material to reflow, so that the sacrificial microchannel structures 110, (which may comprise lines in some cases but may comprise other geometries in other embodiments) seal onto the surfaces and edges of the plurality of devices 102, 102', 102". In an embodiment, the sacrificial microchannel structures 110 may be sealed to top and side surfaces (in some cases all exposed surfaces) of the plurality of devices 102, 102', 102".

Figure 1D:
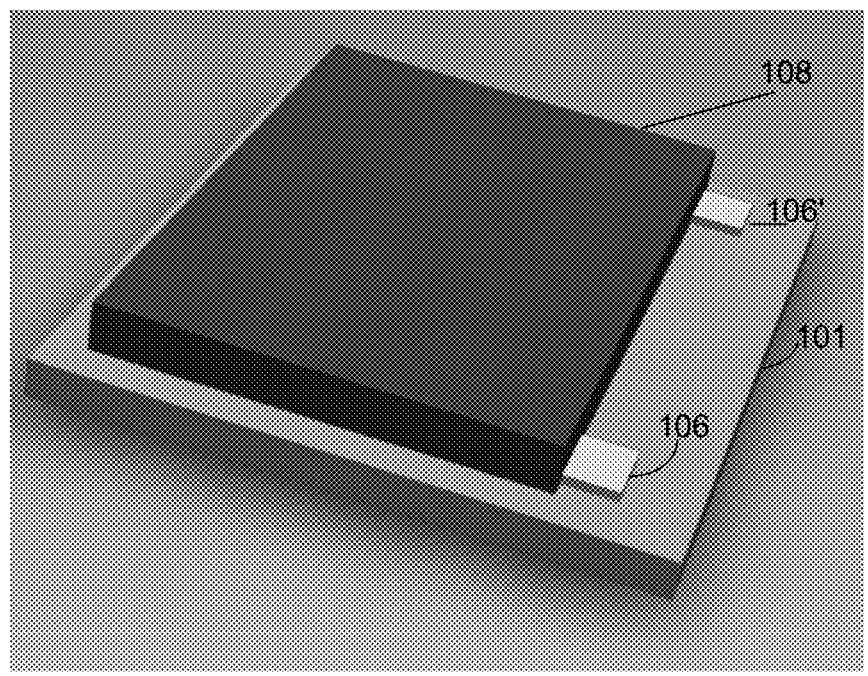
Figure 1E:
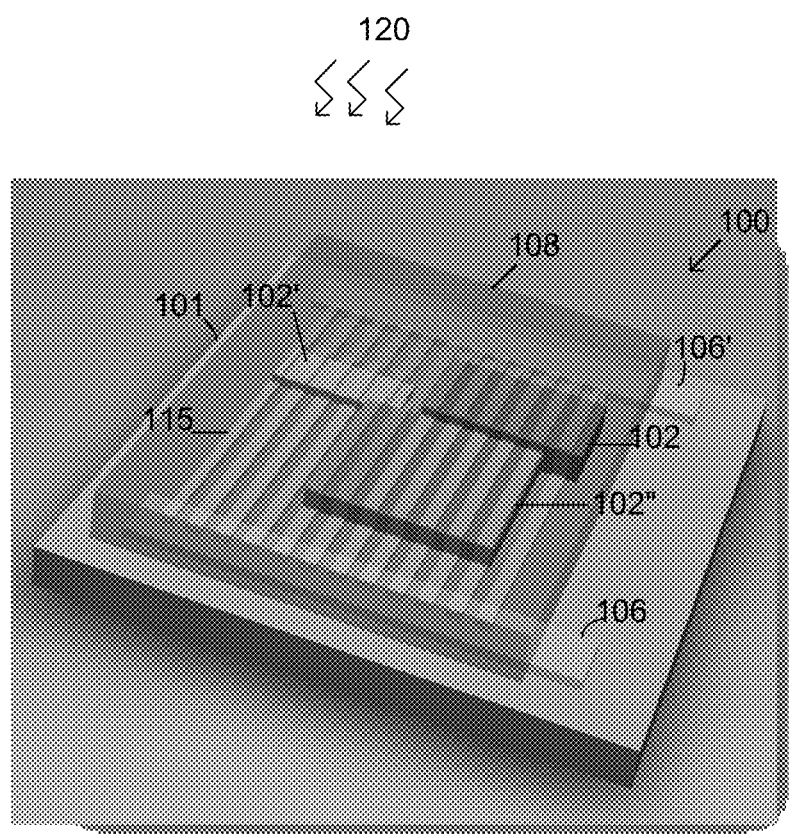

In an embodiment, an overmold material 108 may be formed over the plurality of devices 102, 102', 102" (FIG. 1d). The overmold 108 may comprise any suitable material, such as an epoxy material, for example. In an embodiment, portions of the sacrificial manifolds 106, 106' may not be covered with the overmold material 108. In an embodiment, the package structure 100 may be cured 120 by a curing process. In an embodiment, the cure temperature may comprise a temperature between about 200 degrees Celsius and 300 degrees Celsius (FIG. 1e), but may the cure temperature may comprise other temperatures depending upon the particular design.

The cure process 120 results in the thermal decomposition of the sacrificial microchannel and manifold materials, wherein the solid sacrificial materials undergo a transition from a solid phase into vapor phase/byproducts. Upon the vaporization and evacuation of the sacrificial microchannel and manifold materials from the overmold material 108, microchannel structures 115 are left behind within the overmold material 108. In an embodiment, the evacuation of the sacrificial material thermal decomposition byproducts may be accomplished through the use of a vent hole, but any suitable method for their evacuation may be utilized. Thus, an overmolded package structure 100 may be formed comprising microchannel structures 115 embedded in the overmold material 108 that conform to the surfaces (top and sides) of the devices 102, 102', 102".

Figure 2:
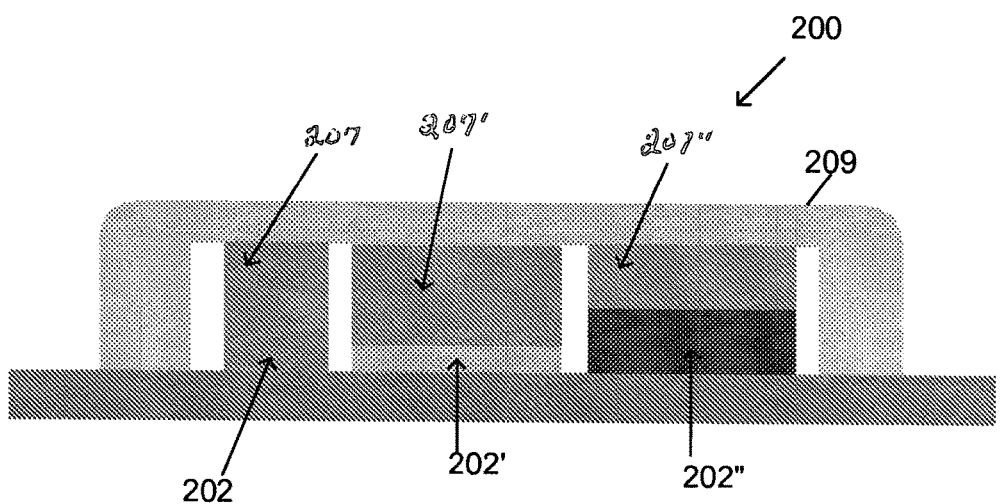
FIG. 2 represents a structure according to the Prior Art.

Thus, the microchannel structures 115 are created directly on the devices, with no modification of the devices. In many prior art package structures, thermal interface materials (TIM's) 207, 207', 207" may be required between devices 202, 202', 202" of different sizes and an integrated heat structure 209 (FIG. 2, Prior Art). The TIM's 207, 207', 207" comprise differing heights because of the variable heights of the devices, which adds design complexity to the prior art package structure 200. A thick TIM (on any die/device) may result in large thermal resistance, which may adversely impact package thermal performance. The embodiments herein do not require TIM structures between the device surface, and the use of an IHS 209 is not required, thus saving expense, fabrication steps and reducing hot spot reliability issues.

The manifolds 106, 106' of the embodiments herein serve as inlet and outlet ports for a fluid coolant, such as a liquid coolant, to the microchannel structures 115. Since the microchannels 115 are conformal to the device surfaces 102, 102', 102", heat removal occurs from the device surface as opposed to prior art cooling systems wherein heat from different die/devices is brought to a common plane for heat removal. Thus, devices 102, 102', 102" utilizing the microchannel structures 115 herein may be cooled at different temperatures from each other, as required by the particular design. Additionally, different cooling substances/types may be used to cool different die on the same substrate. For example, a liquid coolant may be used to cool some of the plurality of die, while a gaseous coolant may be used to cool some others of the plurality of the die/devices. Prior art cooling techniques also require the introduction of additional thermal resistances between the die and the common plane, which is eliminated in the embodiments herein.

The various embodiments of microchannel structures included herein provide liquid cooling of packages at low cost, which enhances the performance of mobile package structures that utilize any of the embodiments herein. Since no TIM material is used, the thermal resistance of package structures utilizing the microchannel structures herein comprise a junction to ambient temperature that is lower than prior art liquid cooling systems, thus improving thermal performance and reduced package power. The microchannels herein allow access to nearly all surfaces of 3D dies/devices, thus liquid cooling with the microchannels herein greatly improves package performance at low manufacturing costs.

Since the microchannel structures are highly configurable (they can be formed in any direction, configuration across the devices according to the particular application), design flexibility is enhanced. Parallel or series networks of microchannels may be formed to limit cross talk, for example. Additionally, multiple inlet and outlet manifolds may be designed to selectively cool higher power/hotter components/devices. Microchannel line widths may also be designed/varied across the devices to achieve higher cooling at some locations, as necessary. High thermal conductivity mold materials are not generally required since cooling of the devices is achieved at the surface of the die.

Figure 3:
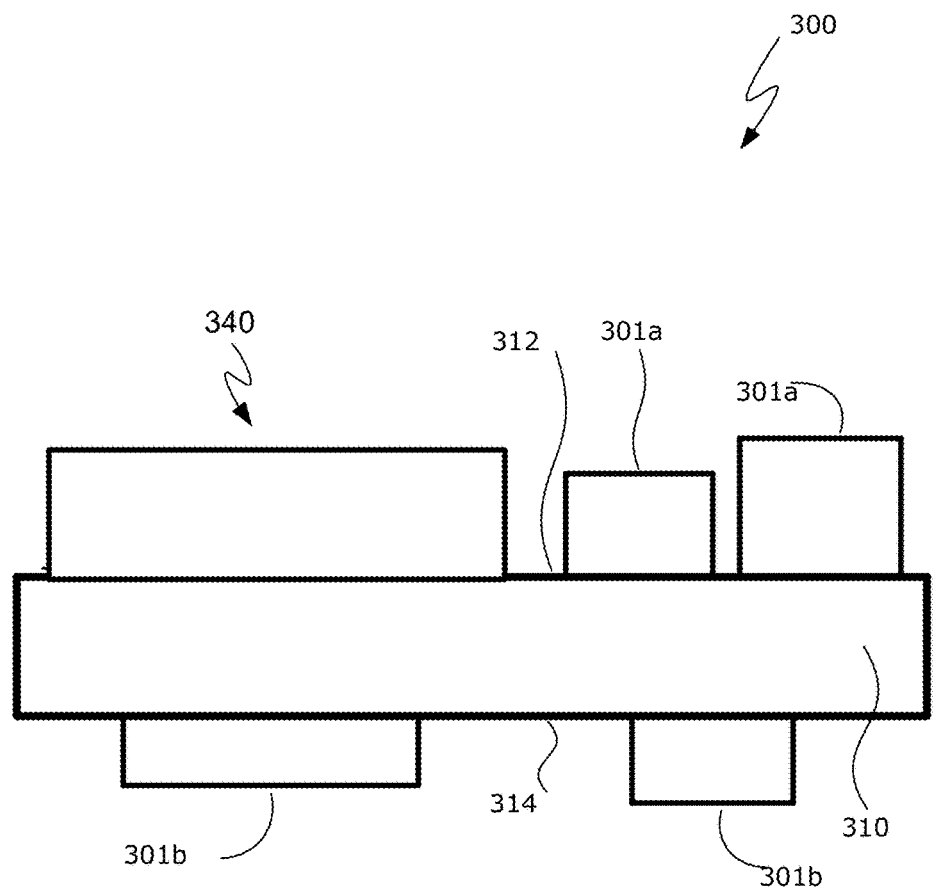
FIG. 3 represents a structure according to embodiments.

Turning now to FIG. 3, illustrated is an embodiment of a computing system 300. The system 300 includes a number of components disposed on a mainboard 310 or other circuit board. Mainboard 310 includes a first side 312 and an opposing second side 314, and various components may be disposed on either one or both of the first and second sides 312, 314. In the illustrated embodiment, the computing system 300 includes a package structure 340 (which may be similar to the package structure 100 of FIG. 1e, for example) disposed on the mainboard's first side 312, wherein the package structure 340 may comprise any of the microchannel structure embodiments described herein.

System 300 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 310 may comprise any suitable type of circuit board or other substrate capable of providing electrical communication between one or more of the various components disposed on the board. In one embodiment, for example, the mainboard 310 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 310. However, it should be understood that the disclosed embodiments are not limited to the above-described PCB and, further, that mainboard 310 may comprise any other suitable substrate.

In addition to the package structure 340, one or more additional components may be disposed on either one or both sides 312, 314 of the mainboard 310. By way of example, as shown in the figures, components 301a may be disposed on the first side 312 of the mainboard 310, and components 301b may be disposed on the mainboard's opposing side 314. Additional components that may be disposed on the mainboard 310 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 300 includes a radiation shield. In a further embodiment, the computing system 300 includes a cooling solution. In yet another embodiment, the computing system 300 includes an antenna. In yet a further embodiment, the assembly 300 may be disposed within a housing or case. Where the mainboard 310 is disposed within a housing, some of the components of computer system 300—e.g., a user interface device, such as a display or keypad, and/or a power supply, such as a battery—may be electrically coupled with the mainboard 310 (and/or a component disposed on this board) but may be mechanically coupled with the housing.

Figure 4:
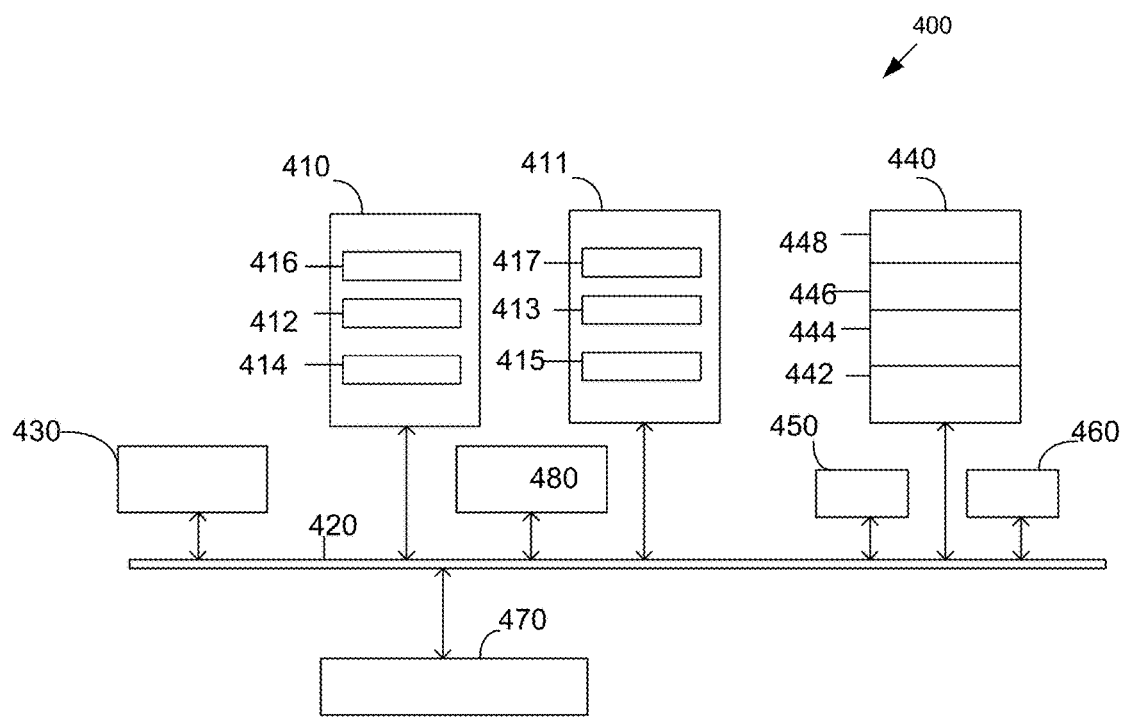
FIG. 4 represents a system according to embodiments.

FIG. 4 is a schematic of a computer system 400 according to an embodiment. The computer system 400 (also referred to as the electronic system 400) as depicted can embody/include a package structure that includes any of the several disclosed embodiments and their equivalents as set forth in this disclosure. The computer system 400 may be a mobile device such as a netbook computer. The computer system 400 may be a mobile device such as a wireless smart phone. The computer system 400 may be a desktop computer. The computer system 400 may be a hand-held reader. The computer system 400 may be integral to an automobile. The computer system 400 may be integral to a television.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 410 through the system bus 420.

The integrated circuit 410 is electrically, communicatively coupled to the system bus 420 and includes any circuit, or combination of circuits according to an embodiment, including the package/device of the various embodiments included herein. In an embodiment, the integrated circuit 410 includes a processor 412 that can include any type of packaging structures according to the embodiments herein. As used herein, the processor 412 may mean any type of circuit such as, but not limited to, a microprocessor, a microcontroller, a graphics processor, a digital signal processor, or another processor. In an embodiment, the processor 412 includes any of the embodiments of the package structures disclosed herein. In an embodiment, SRAM embodiments are found in memory caches of the processor.

Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems. In an embodiment, the processor 412 includes on-die memory 416 such as static random-access memory (SRAM). In an embodiment, the processor 412 includes embedded on-die memory 416 such as embedded dynamic random-access memory (eDRAM).

In an embodiment, the integrated circuit 410 is complemented with a subsequent integrated circuit 411. In an embodiment, the dual integrated circuit 411 includes embedded on-die memory 417 such as eDRAM. The dual integrated circuit 411 includes an RFIC dual processor 413 and a dual communications circuit 415 and dual on-die memory 417 such as SRAM. The dual communications circuit 415 may be configured for RF processing.

At least one passive device 480 is coupled to the subsequent integrated circuit 411. In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448. In an embodiment, the electronic system 400 also includes a display device 450, and an audio output 460. In an embodiment, the electronic system 400 includes an input device such as a controller 470 that may be a keyboard, mouse, touch pad, keypad, trackball, game controller, microphone, voice-recognition device, or any other input device that inputs information into the electronic system 400. In an embodiment, an input device 470 includes a camera. In an embodiment, an input device 470 includes a digital sound recorder. In an embodiment, an input device 470 includes a camera and a digital sound recorder.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A package structure comprising:
   a plurality of devices disposed on a substrate, wherein the plurality of devices comprise different heights; and
   a plurality of hollow microchannel structures disposed directly on the devices, wherein a fluid is capable of flowing through the plurality of hollow microchannel structures to cool the plurality of devices, wherein the plurality of hollow microchannel structures are disposed within an epoxy overmold disposed on the plurality of devices, wherein the plurality of hollow microchannel structures conform to a top surface and a side surface of the plurality of devices.

2. The package structure of claim 1 wherein individual ones of the plurality of hollow microchannel structures are conformal with individual ones of the devices.

3. The package structure of claim 1 further comprising wherein the substrate comprises a 3D package substrate.

4. The package structure of claim 1 further comprising manifolds adjacent the hollow microchannel structures, and disposed within the epoxy overmold, wherein the manifolds are capable of providing entry and exit of cooling fluid.

5. The package structure of claim 1 further comprising wherein the devices do not comprise the same heights as each other.

6. The package structure of claim 1 further comprising wherein the package structure does not comprise a TIM and does not comprise an integrated heat structure.

7. The package structure of claim 1 further comprising wherein the plurality of hollow microchannels are disposed in at least one direction across the device, and wherein the at least one direction comprises at least one of vertical, horizontal and angular directions.

8. The package structure of claim 1 further comprising wherein the plurality of hollow microchannel structures are disposed on the plurality of devices in a plurality of lines comprising a width and a length, and wherein adjacent hollow microchannel structures are not contiguous.

9. The package structure of claim 1 further comprising wherein individual ones of the plurality of devices are capable of being cooled at different temperatures from each other.

10. A package structure comprising:
    a package substrate;
    a device disposed on the package substrate; and
    an overmold disposed on the device, wherein the overmold comprises a microchannel structure that is conformal over a top surface and a side surface of the device.

11. The package structure of claim 10 further comprising wherein the package structure comprises a 3D package structure.

12. The structure of claim 10 further comprising further comprising manifolds adjacent the microchannel structure and disposed within the overmold, wherein the manifolds are capable of providing entry and exit of cooling fluid to cool the device.

13. The structure of claim 10 wherein the device comprises at least one of a CPU, a logic device and a memory device.

14. The structure of claim 10 further comprising a system comprising:
    a bus communicatively coupled to the package structure; and
    an eDRAM communicatively coupled to the bus.

15. A package structure comprising:
    a plurality of devices disposed on a substrate, wherein the plurality of devices comprise different heights; and
    a plurality of microchannel structures disposed on the devices, wherein the plurality of microchannel structures are disposed within an overmold disposed on the plurality of devices, and wherein the plurality of microchannel structures conform to a top surface and a side surface of the plurality of devices.

16. The package structure of claim 15 wherein individual ones of the plurality of microchannel structures are conformal with individual ones of the devices.

17. The package structure of claim 15 further comprising wherein the substrate comprises a 3D package substrate.

18. The package structure of claim 15 further comprising manifolds adjacent the microchannel structures, and disposed within the overmold, wherein the manifolds are capable of providing entry and exit of cooling fluid.

19. The package structure of claim 15 further comprising wherein the devices do not comprise the same heights as each other.

20. The package structure of claim 19 further comprising wherein the package structure does not comprise a TIM and does not comprise an integrated heat structure.

21. The package structure of claim 15 further comprising wherein the plurality of microchannels are disposed in at least one direction across the device, and wherein the at least one direction comprises at least one of vertical, horizontal and angular directions.

22. The package structure of claim 15 further comprising wherein a fluid is capable of flowing through the plurality of microchannel structures to cool the plurality of devices.

23. The package structure of claim 15 further comprising wherein the plurality of microchannel structures are disposed on the plurality of devices in a plurality of lines comprising a width and a length, and wherein adjacent microchannel structures are not contiguous.

24. The package structure of claim 15 further comprising wherein individual ones of the plurality of devices are capable of being cooled at different temperatures from each other.

* * * * *